United States Patent
Crowther et al.

(10) Patent No.: US 9,563,635 B2
(45) Date of Patent: Feb. 7, 2017

(54) AUTOMATED RECOGNITION OF PATTERNS IN A LOG FILE HAVING UNKNOWN GRAMMAR

(71) Applicant: International Business Machines Corporation, Armonk, NY (US)

(72) Inventors: Fiona M. Crowther, Oldham (GB); Geza Geleji, Eastleigh (GB); Martin A. Ross, Gosport (GB)

(73) Assignee: International Business Machines Corporation, Armonk, NY (US)

( * ) Notice: Subject to any disclaimer, the term of this patent is extended or adjusted under 35 U.S.C. 154(b) by 264 days.

(21) Appl. No.: 14/064,605

(22) Filed: Oct. 28, 2013

(65) Prior Publication Data

US 2015/0120682 A1    Apr. 30, 2015

(51) Int. Cl.
*G06F 17/30*    (2006.01)
*H03M 7/30*    (2006.01)

(52) U.S. Cl.
CPC ... *G06F 17/30156* (2013.01); *G06F 17/30153* (2013.01); *H03M 7/30* (2013.01); *H03M 7/3084* (2013.01)

(58) Field of Classification Search
CPC ............... G06F 17/30156; G06F 17/30153; H03M 7/30; H03M 7/3084
See application file for complete search history.

(56) References Cited

U.S. PATENT DOCUMENTS

| | | | |
|---|---|---|---|
| 5,537,551 A * | 7/1996 | Denenberg | H03M 7/42 341/55 |
| 6,691,103 B1 * | 2/2004 | Wozny | G06F 17/30424 |
| 7,643,682 B2 | 1/2010 | Bronstein | |
| 7,778,979 B2 | 8/2010 | Hätönen et al. | |
| 7,822,850 B1 | 10/2010 | Brikman et al. | |
| 2006/0085788 A1 | 4/2006 | Amir et al. | |
| 2007/0283194 A1 * | 12/2007 | Villella | G06F 11/3476 714/57 |
| 2009/0119307 A1 * | 5/2009 | Braun | G06F 17/30985 |
| 2012/0056763 A1 * | 3/2012 | Motta | H03M 7/40 341/87 |
| 2012/0209882 A1 | 8/2012 | Chen et al. | |

OTHER PUBLICATIONS

Yuri et al., "Speeding Up HMM Decoding and Training by Exploiting Sequence Repetitions", Jun. 2007, Springer Science.*

(Continued)

*Primary Examiner* — Rehana Perveen
*Assistant Examiner* — Huen Wong
(74) *Attorney, Agent, or Firm* — Noah A. Sharkan

(57) ABSTRACT

Embodiments of the present invention disclose a method, computer program product, and system for recognizing patterns in log files with unknown grammar. A computer replaces one or more alphanumeric strings with a first alphanumeric character to generate a first resulting string. The computer then replaces one or more identical pairs of characters of the first resulting string with a second alphanumeric character to generate a second resulting string. The computer then replaces one or more consecutive instances of the second alphanumeric character, in the second resulting string, with one instance of the second alphanumeric character to generate a compressed string.

17 Claims, 4 Drawing Sheets

| ORIGINAL STRING | state:STATE_{ALL_PRECEDING_RESOLVED \|ATTRIBUTES_RESOLVED\|FOLLOWING_RESOLVED\|NAMESPACE_NODES_RESOLVED\|DIRTY \|SUBTREE_DIRTY\|FIRST_CHILD_RESOLVED \|STATE_NODES_REORDERED\|ALLOW_FAST_ACCESS} |
|---|---|
| REDUCTION TO SINGLE ALPHANUMERIC SYMBOL | x:x_{x_x_x\|x_x\|x_x_x\|x\|x_x_x\|x_x_x\|x_x_x} |
| REPLACEMENT OF CHARACTER PAIR "x_" WITH "y" | x:y{yyx\|yx\|yx\|yyx\|x\|yx\|yyx\|yyx} |
| REPLACEMENT OF REPETITIOUS SYMBOLS WITH A SINGLE INSTANCE OF THAT SYMBOL | x:y{yx\|yx\|yx\|yx\|yx\|yx\|yx} |
| REPLACEMENT OF CHARACTER PAIR "x\|" WITH "z" | x:y{yZyZyZyZZyZyZyZyx} |
| REPLACEMENT OF REPETITIOUS SYMBOLS WITH A SINGLE INSTANCE OF THAT SYMBOL | x:y{yZyZyZyZyZyZyx} |
| REPLACEMENT OF CHARACTER PAIR "yZ" WITH "A" | x:y{AAAAAAAyx} |
| REPLACEMENT OF REPETITIOUS SYMBOLS WITH A SINGLE INSTANCE OF THAT SYMBOL | x:y{Ayx} |

300

(56) References Cited

OTHER PUBLICATIONS

Shibata, "Speeding Up Pattern Matching by Text Compression", 2000, Springer-Verlag.*
Blohm et al., "Using the Web to Reduce Data Sparseness in Pattern-based Information Extraction", Proceedings of the 11th European Conference on Principles and Practice of Knowledge Discovery in Databases (PKDD), Copyright Springer 2007.
Manji, Ali, "Analyzing WebShere Application Server Logs Using the WebSphere Studio Log Analysis Tool", IBM Developer Works, Aug. 5, 2003, website: <http://www/ibm.com/developerworks/webshere/library/techarticles>.
Memon, Ahmed Umar, "Log File Categorization and Anomaly Analysis Using Grammar Inference", Queen's University, Kingston, Ontario, Canada, May 2008, Copyright © Ahmed Umar Memon, 2008.
"Cluster Case Studies: Byte Pair Encoding: The Problem", retrieved on Jul. 3, 2013 from website: <http://www.csse.monash.edu.au/cluster/RJK/Compress/problem.html>.

* cited by examiner

AUTOMATED RECOGNITION OF PATTERNS IN A LOG FILE HAVING UNKNOWN GRAMMAR

FIELD OF THE INVENTION

The present invention relates generally to the field of log file analysis, and more particularly to recognizing patterns in a log file having unknown grammar.

BACKGROUND OF THE INVENTION

Log files present information on events occurring in computer systems. Log files are helpful in diagnosing errors occurring in the computer system. The computer system stores log files in human-readable formats (e.g., text). Log files may store information for subsequent review by humans in repairing errors in the computer system. The computer system writes log files according to a set list of rules called a grammar. The complete grammar defines the rules of a formal language. A grammar describes how to form strings of text from the language's alphabet (e.g. alphanumeric characters) that are valid according to the language's syntax. The language's syntax is the set of rules that defines the combinations of characters that are correctly structured in the language.

SUMMARY

Embodiments of the present invention disclose a method, computer program product, and system for recognizing patterns in log files with unknown grammar. A computer replaces one or more of a plurality of alphanumeric strings with a first alphanumeric character to generate a first resulting string. The computer then replaces one or more identical pairs of characters of the first resulting string with a second alphanumeric character to generate a second resulting string. The computer then replaces one or more consecutive instances of the second alphanumeric character, in the second resulting string, with one instance of the second alphanumeric character to generate a compressed string.

DETAILED DESCRIPTION

Figure 1:
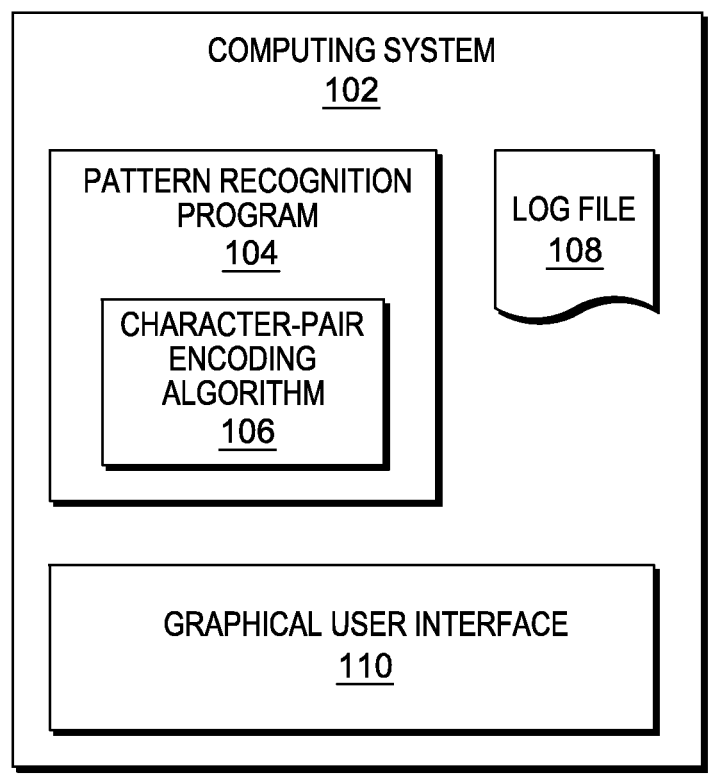
FIG. 1 is a functional block diagram illustrating a computing system, in accordance with an embodiment of the present invention.

Embodiments of the present invention recognize that log files are generally written in human-readable format, but often the quantity of data contained in the log file prevents humans from being able to efficiently interpret the data. Computer systems may construct log files in languages that have a large set of grammatical rules that prevent construction of an exact language parser that can eliminate redundant information and provide the reader only with informative features contained in the file. Because of the complexity of these grammars, the reader may not know the complete grammar that describes the file. The present disclosure describes a method, program product, and computing system for identifying patterns of punctuation character usage to identify passages of information that are likely to convey similar information. Embodiments of the present invention may be used to construct visual aids, such as syntax highlighting, suitable for human interpretation and further automated processing.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer-readable medium(s) having computer readable program code/instructions embodied thereon.

Any combination of computer-readable media may be utilized. Computer-readable media may be a computer-readable signal medium or a computer-readable storage medium. A computer-readable storage medium may be, for example, but not limited to, an electronic, magnetic, optical, electromagnetic, infrared, or semiconductor system, apparatus, or device, or any suitable combination of the foregoing. More specific examples (a non-exhaustive list) of a computer-readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer-readable storage medium may be any tangible medium that can contain, or store a program for use by or in connection with an instruction execution system, apparatus, or device.

A computer-readable signal medium may include a propagated data signal with computer-readable program code embodied therein, for example, in baseband or as part of a carrier wave. Such a propagated signal may take any of a variety of forms, including, but not limited to, electro-magnetic, optical, or any suitable combination thereof. A computer-readable signal medium may be any computer-readable medium that is not a computer-readable storage medium and that can communicate, propagate, or transport a program for use by or in connection with an instruction execution system, apparatus, or device.

Program code embodied on a computer-readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java®, Smalltalk, C++ or the like and conventional procedural programming languages, such as the "C" programming language or similar programming languages. The program code may execute entirely on a user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer, other programmable data processing apparatus, or other devices to function in a particular manner, such that the instructions stored in the computer-readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer-implemented process such that the instructions which execute on the computer or other programmable apparatus provide processes for implementing the functions/acts specified in the flowchart and/or block diagram block or blocks.

The present invention will now be described in detail with reference to the Figures. FIG. 1 is a functional block diagram illustrating a computing system, in accordance with an embodiment of the present invention. Computing system 102 may be a laptop computer, tablet computer, netbook computer, personal computer (PC), a desktop computer, a personal digital assistant (PDA), a smart phone, or any programmable electronic device. Computing system 102 may include internal and external hardware components, as depicted and described in further detail with respect to FIG. 4. Computing system 102 includes pattern recognition program 104, log file 108, and graphical user interface (GUI) 110.

Pattern recognition program 104 is stored on computing system 102. Pattern recognition program 104 reduces strings of characters in a log file having an unknown grammar in order to identify strings that are similar. For example, pattern recognition program 104 replaces strings of alphanumeric characters with a single character, for example, to identify syntactical structure. This technique will be described in more detail with respect to FIG. 2. In one embodiment, pattern recognition program 104 compresses the resulting strings using a character-pair encoding algorithm, such as character-pair encoding algorithm 106. Character-pair encoding algorithm 106 locates the most common pair of characters and replaces those pairs with a single alphanumeric character. Character-pair encoding algorithm 106 runs until there are no more character pairs that occur more than a threshold value, which can be set by, for example, a user through GUI 110. In one embodiment, pattern recognition program 104 replaces consecutive instances of identical characters with a single instance of that character.

Character-pair encoding algorithm 106 is a well known algorithm used to collapse the most common pair of characters into a single character that does not occur in the original data. For example, the string "aabaabab" has three occurrences of the character pair "ab." Pattern recognition program 104 replaces all three occurrences of "ab" with a third character that does not appear in the original string, such as "c". Therefore, after the character-pair encoding takes place, the string would be in the form "acacc". Pattern recognition program 106 then saves the rule: "c=ab". As the character-pair encoding algorithm runs multiple times, a collection of rules is generated, which can be used to reconstruct the original data.

Log file 108 is a file that records events taking place during execution of a system in order to provide a trail that can be used to understand the activity of the system and to diagnose problems. Log file 108 includes alphanumeric characters, punctuation characters, and white spaces. The characters and spaces are arranged according to a grammar that may not be known, in order to convey information on the function of computer system 102. White spaces define individual strings of data. Log file 108 can be written in a variety of grammars such as Java source code fragments, XML, property lists, memory dumps, or a combination of grammars.

GUI 110 is stored on computing system 102. GUI 110 is an interface that allows users to communicate and control pattern recognition program 104. In an embodiment, GUI 110 can include graphical elements that allow users to set a minimum number of character pairs that must exist in order to execute pattern recognition program 104. In an embodiment, GUI 110 includes a syntax highlighting tool, which highlights similar strings of characters in order to facilitate user consumption of data in log file 108.

Figure 2:
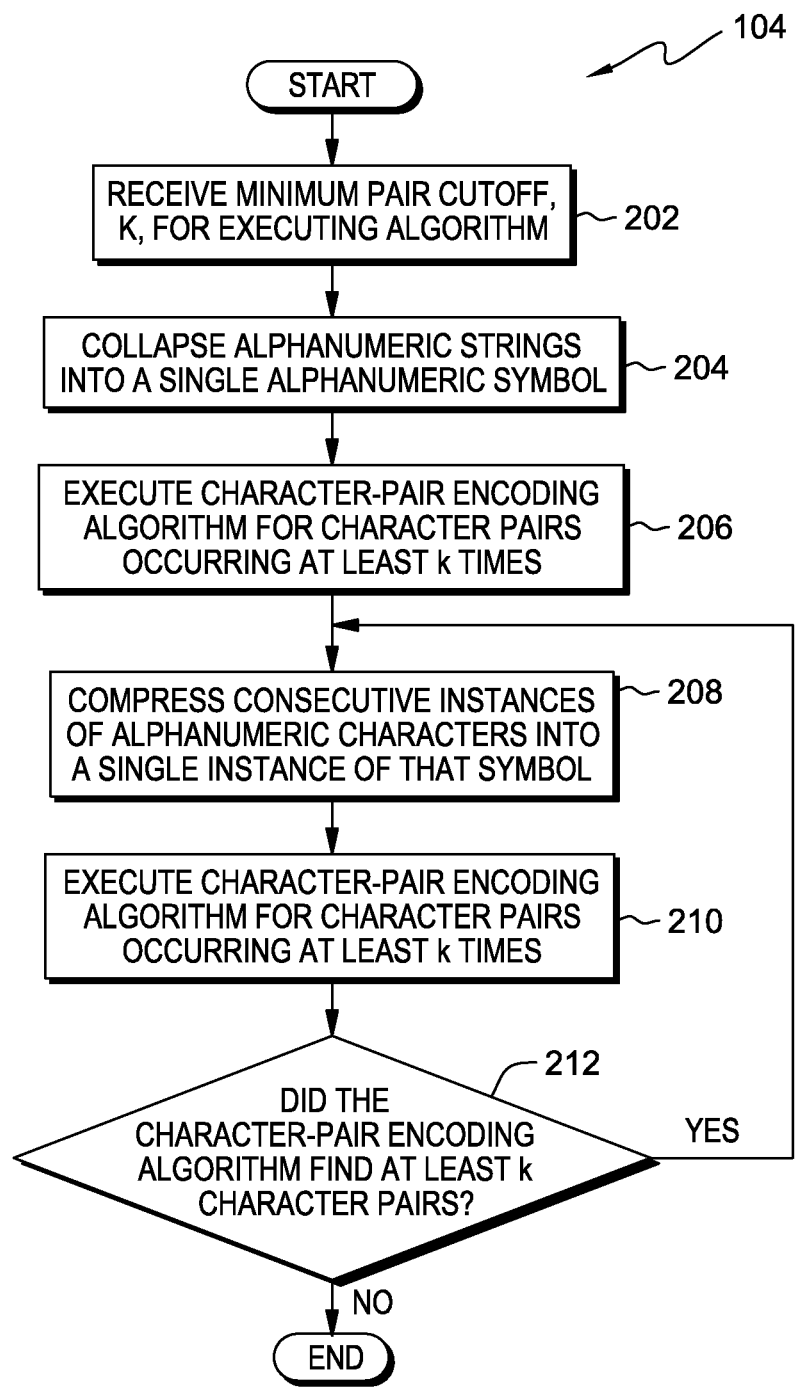
FIG. 2 is a flowchart depicting operational steps of a pattern recognition program for analyzing log files with unknown grammars, in accordance with an embodiment of the present invention.

FIG. 2 is a flowchart depicting operational steps of pattern recognition program 104 for analyzing log files having unknown grammars, in accordance with an embodiment of the present invention.

Pattern recognition program 104 receives a minimum pair cutoff, k, for executing the character-pair encoding algorithm (step 202). The minimum cutoff can be received, for example, from a user through a GUI, e.g. GUI 110. The minimum cutoff provides pattern recognition program 104 with a minimum required number of detected character pairs. The character-pair encoding algorithm determines what the most common character pair is, and how many times it occurs. Pattern recognition program 104 compares the number of occurrences of the most common character pair with k. If the number of detected pairs is greater than k, then pattern recognition program 104 will replace the character pair with a single new character. If the number of detected pairs is less than k, then the pattern recognition program will terminate.

Pattern recognition program 104 collapses all alphanumeric strings into a single alphanumeric symbol (step 204). Pattern recognition program 104 locates individual strings of alphanumeric characters which may be separated by, for example, periods, commas, or spaces, and replaces each string with a single alphanumeric character. The resulting data is a string of data that consists only of a single alphanumeric character, punctuation characters, and spaces. The data represents the syntax and the grammar of the log file without the actual system information contained in the log file. For example, pattern recognition program 104 reduces a string, "jlasdkjflkas.kjsdf.com@987234", to "x.x.x@x" where "x" replaces the alphanumeric characters in the string.

Pattern recognition program 104 executes the character-pair encoding algorithm for the most frequently occurring character pair occurring at least k times (step 206). Pattern recognition program 104 searches for character pairs that occur at least k times, and then replaces the pairs with a character that does not occur in the data. For example, the string "x.x.x@x" contains the character pair "x." two times. In an embodiment, pattern recognition program 104 replaces "x." with a new alphanumeric character, such as "b". The string becomes "bbx@x". In one embodiment, multiple character pairs may appear the same number of times. In this embodiment, pattern recognition program 104 includes a pre-defined precedence. The pre-defined precedence includes a hierarchy of symbols, so pattern recognition program encodes those character pairs that include a higher ranked character than those that do not. In another embodiment, pattern recognition program simply chooses at random which character pair to encode first.

Pattern recognition program 104 compresses consecutive instances of a particular alphanumeric character into a single instance of that character (step 208). If multiple instances of the same character pair occur in a row, then when pattern recognition program 104 executes the character-pair encoding algorithm, the resulting data string will include multiple instances of the same alphanumeric character in a row. Step 208 replaces these uninterrupted strings of identical characters with a single instance of that character in order to eliminate redundant information. For example, in the example above, the string "bbx@x" becomes "bx@x".

Pattern recognition program 104 executes the character-pair encoding algorithm for character pairs occurring at least k times (step 210). Pattern recognition program 104 replaces each instance of the most frequently occurring character pair with a single character that does not already occur in the data. Pattern recognition program 104 may perform step 210 in the same manner as step 206.

Pattern recognition program 104 determines whether the character-pair encoding algorithm located at least one character pair that occurred at least k times (decision block 212). In response to determining that there is at least one character pair that occurs at least k times (decision block 212 yes branch), pattern recognition program 104 returns to step 208 and compresses consecutive instances of a character into a single instance of that character. In response to determining that the data does not contain any more character pairs that occur at least k times (decision block 212 no branch), pattern recognition program 104 terminates.

The compressed data generated by pattern recognition program 104 can be displayed for analysis by a user by, for example, GUI 110. GUI 110 displays the data as compressed by pattern recognition program 104. In one embodiment, GUI 110 includes a syntax highlighter tool. The syntax highlighter displays the data in the compressed log file so that strings of data that have the same syntax form are the same color. Syntax highlighting is useful, for example, for locating strings of data having a similar grammatical structure, and therefore, are likely to contain similar data. In one embodiment, GUI 110 displays the original log file which is reconstructed with the syntax highlighting applied to similar strings of data in the log file.

Figure 3:
FIG. 3 is a table depicting the evolution of a string being modified by the operational steps of a pattern recognition program for analyzing log files with unknown grammars, in accordance with an embodiment of the present invention.

FIG. 3 is a table depicting compression phases 300 of a string being modified by the operational steps of pattern recognition program 104, in accordance with an embodiment of the present invention.

In this embodiment, pattern recognition program 104 modifies the original string depicted in FIG. 3 by replacing all alphanumeric strings with a first alphanumeric character, "x". Pattern recognition program 104 replaces the most common character pair with a second alphanumeric character, e.g. "y" in the depicted embodiment. Pattern recognition program 104 replaces consecutive instances of a character with a single instance of that character. In this embodiment, single instances of the character "y" replace consecutive instances of the character "y". Pattern recognition program 104 replaces the most common character pairs, "x|" in the depicted embodiment, with a single character, such as "Z". Pattern recognition program 104 replaces repetitious characters with a single instance of that character. In this embodiment, a single instance of the character "Z" replaces "ZZ".

Pattern recognition program 104 again replaces the most common pair of alphanumeric characters with a single character by, for example, using the character-pair encoding algorithm. In this embodiment, pattern recognition program 104 replaces the character pair "yZ" with the character "A". Pattern recognition program 104 replaces consecutive instances of any alphanumeric character with a single instance of that character. In the depicted embodiment, the resulting string is "x:y{Ayx}". It should be noted that in this embodiment the minimum pair cutoff, k, is six or less because there are seven instances of the character pair "yZ", which is the last character pair that pattern recognition program 104 replaces.

Figure 4:
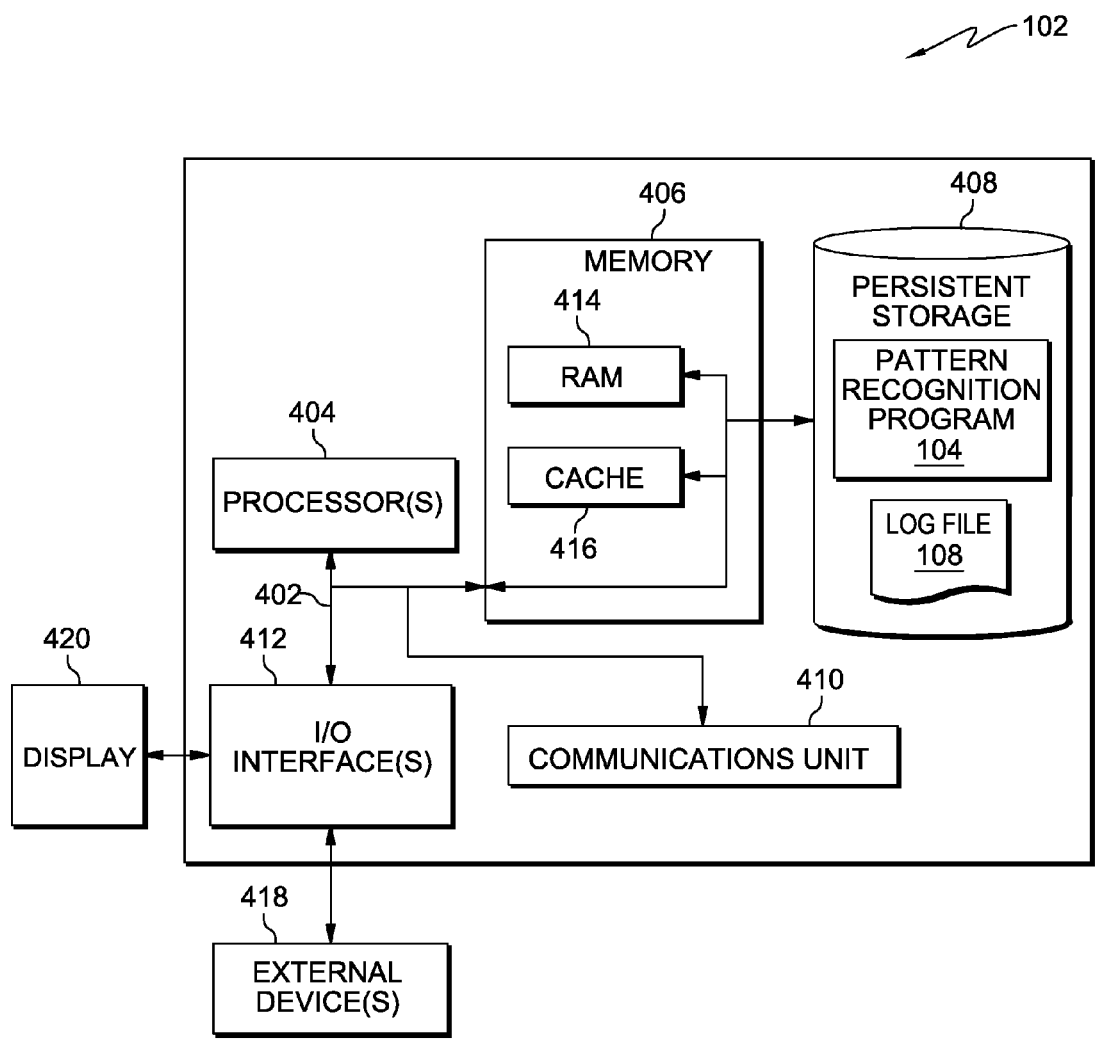
FIG. 4 depicts a block diagram of components of the computing system executing the pattern recognition program, in accordance with an embodiment of the present invention.

FIG. 4 depicts a block diagram of components of computing system 102, in accordance with an illustrative embodiment of the present invention. It should be appreciated that FIG. 4 provides only an illustration of one implementation and does not imply any limitations with regard to the environments in which different embodiments may be implemented. Many modifications to the depicted environment may be made.

Computing system 102 includes communications fabric 402, which provides communications between computer processor(s) 404, memory 406, persistent storage 408, communications unit 410, and input/output (I/O) interface(s) 412. Communications fabric 402 can be implemented with any architecture designed for passing data and/or control information between processors (such as microprocessors, communications and network processors, etc.), system memory, peripheral devices, and any other hardware components within a system. For example, communications fabric 402 can be implemented with one or more buses.

Memory 406 and persistent storage 408 are computer-readable storage media. In this embodiment, memory 406 includes random access memory (RAM) 414 and cache memory 416. In general, memory 406 can include any suitable volatile or non-volatile computer-readable storage media.

Pattern recognition program 104 and log file 108 are stored in persistent storage 408 for execution and/or access by one or more of the respective computer processors 404 via one or more memories of memory 406. In this embodiment, persistent storage 408 includes a magnetic hard disk drive. Alternatively, or in addition to a magnetic hard disk drive, persistent storage 408 can include a solid state hard drive, a semiconductor storage device, read-only memory (ROM), erasable programmable read-only memory (EPROM), flash memory, or any other computer-readable storage media that is capable of storing program instructions or digital information.

The media used by persistent storage 408 may also be removable. For example, a removable hard drive may be used for persistent storage 408. Other examples include optical and magnetic disks, thumb drives, and smart cards that are inserted into a drive for transfer onto another computer-readable storage medium that is also part of persistent storage 408.

Communications unit 410, in these examples, provides for communications with other data processing systems or devices. In these examples, communications unit 410 includes one or more network interface cards. Communications unit 410 may provide communications through the use of either or both physical and wireless communications links. Pattern recognition program 104 and log file 108 may be downloaded to persistent storage 408 through communications unit 410.

I/O interface(s) 412 allows for input and output of data with other devices that may be connected to computing system 102. For example, I/O interface 412 may provide a connection to external devices 418 such as a keyboard, keypad, a touch screen, and/or some other suitable input device. External devices 418 can also include portable computer-readable storage media such as, for example, thumb drives, portable optical or magnetic disks, and memory cards. Software and data used to practice embodiments of the present invention, e.g., pattern recognition program 104 and log file 108, can be stored on such portable computer-readable storage media and can be loaded onto persistent storage 408 via I/O interface(s) 412. I/O interface(s) 412 also connect to a display 420.

Display 420 provides a mechanism to display data to a user and may be, for example, a computer monitor.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

What is claimed is:

1. A method for eliminating redundant information in a log file having unknown grammar, the method comprising:

identifying, by one or more computer processors, an alphanumeric string in a log file, the alphanumeric string comprising a plurality of alphanumeric substrings separated by non-alphanumeric characters, the plurality of alphanumeric substrings including at least two distinct alphanumeric substrings;

replacing, by the one or more computer processors, each alphanumeric substring of the plurality of alphanumeric substrings with a first alphanumeric character to generate a first resulting string that includes the non-alphanumeric characters and multiple occurrences of the first alphanumeric character;

replacing, by the one or more computer processors, each pair of characters of the first resulting string that is identical to another pair of characters of the first resulting string with a second alphanumeric character to generate a second resulting string, wherein replacing each pair of characters of the first resulting string that is identical to another pair of characters of the first resulting string with a second alphanumeric character to generate a second resulting string comprises:

responsive to determining that there are multiple distinct pairs of characters of the first resulting string that are identical to another pair of characters of the first resulting string and that the multiple distinct pairs of characters occur an equal number of times in the first resulting string, selecting, by the one or more computer processors, a pair of the multiple distinct pairs of characters based on a pre-defined hierarchy of characters included in the multiple distinct pairs of characters, and replacing, by the one or more computer processors, the selected pair of characters with the second alphanumeric character to generate the second resulting string; and replacing, by the one or more computer processors, consecutive occurrences of the second alphanumeric character, in the second resulting string, with one occurrence of the second alphanumeric character to generate a compressed string.

2. The method of claim 1, wherein the replacement of each pair of characters of the first resulting string that is identical to another pair of characters of the first resulting string is responsive to determining, by the one or more computer processors, that a number of occurrences of a pair of characters of the first resulting string that is identical to another pair of characters of the first resulting string is equal to or greater than a minimum cutoff value.

3. The method of claim 1, wherein the replacement of each pair of characters of the first resulting string that is identical to another pair of characters of the first resulting string is achieved by a byte-pair encoding algorithm.

4. The method of claim 1, further comprising:

associating the second alphanumeric character with each pair of characters of the first resulting string that is identical to another pair of characters of the first resulting string to create a substitution rule.

5. The method of claim 4, further comprising:

generating a list of substitution rules for a plurality of created substitution rules within the log file.

6. The method of claim 1, further comprising:

identifying an additional second compressed string having a similar structure as the generated compressed string; and highlighting the generated compressed string and the additional compressed string in a user interface.

7. A computer program product for eliminating redundant information in a log file having unknown grammar, the computer program product comprising:
one or more computer-readable storage media and program instructions stored on the one or more computer-readable storage media, the program instructions comprising:
program instructions to identify an alphanumeric string in a log file, the alphanumeric string comprising a plurality of alphanumeric substrings separated by non-alphanumeric characters, the plurality of alphanumeric substrings including at least two distinct alphanumeric substrings;
program instructions to replace each alphanumeric substring of the plurality of alphanumeric substrings with a first alphanumeric character to generate a first resulting string that includes the non-alphanumeric characters and multiple occurrences of the first alphanumeric character;
program instructions to replace each pair of characters of the first resulting string that is identical to another pair of characters of the first resulting string with a second alphanumeric character to generate a second resulting string, wherein the program instructions to replace each pair of characters of the first resulting string that is identical to another pair of characters of the first resulting string with a second alphanumeric character to generate a second resulting string comprise:
program instructions to, responsive to determining that there are multiple distinct pairs of characters of the first resulting string that are identical to another pair of characters of the first resulting string and that the multiple distinct pairs of characters occur an equal number of times in the first resulting string, select a pair of the multiple distinct pairs of characters based on a pre-defined hierarchy of characters included in the multiple distinct pairs of characters, and program instructions to replace the selected pair of characters with a second alphanumeric character to generate a second resulting string; and
program instructions to replace consecutive occurrences of the second alphanumeric character, in the second resulting string, with one occurrence of the second alphanumeric character to generate a compressed string.

8. The computer program product of claim 7, wherein the replacement of each pair of characters of the first resulting string that is identical to another pair of characters of the first resulting string is responsive to determining that a number of occurrences of a pair of characters of the first resulting string that is identical to another pair of characters of the first resulting string is equal to or greater than a minimum cutoff value.

9. The computer program product of claim 7, wherein the replacement of each pair of characters of the first resulting string that is identical to another pair of characters of the first resulting string is achieved by a byte-pair encoding algorithm.

10. The computer program product of claim 7, further comprising:
program instructions to associate the second alphanumeric character with each pair of characters of the first resulting string that is identical to another pair of characters of the first resulting string to create a substitution rule.

11. The computer program product of claim 10, further comprising:
program instructions to generate a list of substitution rules for a plurality of created substitution rules within the log file.

12. The computer program product of claim 7, further comprising:
program instructions to identify an additional second compressed string having a similar structure as the generated compressed string; and
program instructions to highlight the generated compressed string and the additional compressed string in a user interface.

13. A computer system for eliminating redundant information in a log file having unknown grammar, the computer system comprising:
one or more computer processors;
one or more computer-readable storage media;
program instructions stored on the computer-readable storage media for execution by at least one of the one or more processors, the program instructions comprising:
program instructions to identify an alphanumeric string in a log file, the alphanumeric string comprising a plurality of alphanumeric substrings separated by non-alphanumeric characters, the plurality of alphanumeric substrings including at least two distinct alphanumeric substrings;
program instructions to replace each alphanumeric substring of the plurality of alphanumeric substrings with a first alphanumeric character to generate a first resulting string that includes the non-alphanumeric characters and multiple occurrences of the first alphanumeric character;
program instructions to replace each pair of characters of the first resulting string that is identical to another pair of characters of the first resulting string with a second alphanumeric character to generate a second resulting string, wherein the program instructions to replace each pair of characters of the first resulting string that is identical to another pair of characters of the first resulting string with a second alphanumeric character to generate a second resulting string comprise:
program instructions to, responsive to determining that there are multiple distinct pairs of characters of the first resulting string that are identical to another pair of characters of the first resulting string and that the multiple distinct pairs of characters occur an equal number of times in the first resulting string, select a pair of the multiple distinct pairs of characters based on a pre-defined hierarchy of characters included in the multiple distinct pairs of characters, and program instructions to replace the selected pair of characters with a second alphanumeric character to generate a second resulting string; and
program instructions to replace consecutive occurrences of the second alphanumeric character, in the second resulting string, with one occurrence of the second alphanumeric character to generate a compressed string.

14. The computer system of claim 13, wherein the replacement of each pair of characters of the first resulting string that is identical to another pair of characters of the first resulting string is responsive to determining that a number of occurrences of a pair of characters of the first resulting string that is identical to another pair of characters of the first resulting string is equal to or greater than a minimum cutoff value.

15. The computer system of claim 13, wherein the replacement of each pair of characters of the first resulting string that is identical to another pair of characters of the first resulting string is achieved by a byte-pair encoding algorithm.

16. The computer system of claim 13, further comprising:
program instructions to associate the second alphanumeric character with each pair of characters of the first resulting string that is identical to another pair of characters of the first resulting string to create a substitution rule; and
program instructions to generate a list of substitution rules for a plurality of created substitution rules within the log file.

17. The computer system of claim 13, further comprising:
program instructions to identify an additional second compressed string having a similar structure as the generated compressed string; and
program instructions to highlight the generated compressed string and the additional compressed string in a user interface.

* * * * *